(12) United States Patent
Yang

(10) Patent No.: US 7,129,517 B2
(45) Date of Patent: Oct. 31, 2006

(54) SEMICONDUCTOR DEVICE WITH DIFFERENT LATTICE PROPERTIES

(75) Inventor: Jeong-Hwan Yang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/801,651

(22) Filed: Mar. 17, 2004

(65) Prior Publication Data

US 2004/0185626 A1 Sep. 23, 2004

(30) Foreign Application Priority Data

Mar. 17, 2003 (KR) ............... 10-2003-0016450

(51) Int. Cl.
*H01L 29/06* (2006.01)
*H01L 31/072* (2006.01)
*H01L 31/109* (2006.01)
*H01L 31/0328* (2006.01)
*H01L 31/0336* (2006.01)

(52) U.S. Cl. ............... 257/20; 257/18; 257/19
(58) Field of Classification Search ............ 257/19, 257/18, 20, 12, 13, 14, 192, 200, 616, 15, 257/903, 618, 347, 67, 330, 353, 189, 74, 257/194

See application file for complete search history.

(56) References Cited

U.S. PATENT DOCUMENTS

| | | | |
|---|---|---|---|
| 5,879,996 A * | 3/1999 | Forbes | 438/289 |
| 6,300,182 B1 * | 10/2001 | Yu | 438/217 |
| 6,774,390 B1 * | 8/2004 | Sugiyama et al. | 257/19 |
| 6,855,990 B1 * | 2/2005 | Yeo et al. | 257/353 |
| 6,867,428 B1 * | 3/2005 | Besser et al. | 257/19 |
| 6,921,982 B1 * | 7/2005 | Joshi et al. | 257/349 |
| 2004/0217420 A1 * | 11/2004 | Yeo et al. | 257/347 |
| 2005/0017377 A1 * | 1/2005 | Joshi et al. | 257/903 |

* cited by examiner

*Primary Examiner*—Walter L. Lindsay, Jr.
(74) *Attorney, Agent, or Firm*—Volentine Francos & Whitt, PLLC

(57) ABSTRACT

To reduce a current loss through a channel and improve electron mobility, a first semiconductor layer and a second semiconductor layer (sequentially formed on a semiconductor substrate) have different lattice properties. The first semiconductor layer and the second semiconductor layer may be etched to form a first semiconductor pattern. A third semiconductor layer having a lattice property substantially identical to that of the first semiconductor layer may be formed over the first semiconductor pattern. The third semiconductor layer may then be etched to form a second semiconductor pattern. A gate may be formed on the second semiconductor pattern. The contact surface between the second semiconductor pattern and the gate pattern may consequently increased to reduce a current loss. Further, the lattice properties may be changed to improve electron mobility of the semiconductor layers.

20 Claims, 7 Drawing Sheets

SEMICONDUCTOR DEVICE WITH DIFFERENT LATTICE PROPERTIES

CROSS REFERENCE TO RELATED APPLICATION

This application claims priority under 35 USC § 119 to Korean Patent Application No. 2003-16450, filed on Mar. 17, 2003, the contents of which are incorporated herein by reference in their entirety.

BACKGROUND OF THE INVENTION

1. Field of the Invention

The present invention relates to a semiconductor device or a method of manufacturing a semiconductor device. Embodiments of the present invention are capable of reducing current loss in a semiconductor device by increasing the contact surface between channel and a gate. This reduction of current loss may be accomplished by improving electron mobility by manipulating lattice properties of the channel.

2. Description of the Related Art

Transistors are semiconductor devices with great utility and are necessary in modern computers. Transistors are also used in communication systems, such as telephone systems and the Internet. Over time, modern computers and communication systems have continuously improved. Improvements include the miniaturization of devices, the increase in speed of devices, and lowering of power consumption of devices. These improvements have allowed computers and telephones to be much more powerful, while also becoming more affordable.

Two techniques that are used during semiconductor device manufacturing are scaling down and integration. Scaling down and integration of semiconductor devices (e.g. transistors) may be achieved by downsizing structures of the semiconductor devices. As semiconductor devices become smaller and are downsized, more semiconductor devices can be included (i.e. integrated) in a single chip. Further, downsizing decreases the time needed for electrons to pass through a transistor, which reduces processing time of a transistor. In other words, downsizing allows a transistor to work faster. Downsizing also minimizes the quantity of electrons flowing through a transistor. By minimizing this quantity of electrons, power consumption of a transistor is also minimized.

High integration, high speed, and low electric power consumption of transistors have improved transistor performance. A minimum width of the semiconductor transistor has evolved from 10 µm in 1971, to 0.25 µm in 1997, and to 90 nm in 2003. Over the past 30 years, transistors have been downsized by a factor of about 50. Further, transistors have been integrated by a factor of about 10,000. Chip speed has improved by a factor of about 1,000. Currently, transistors having a width of about 90 nm are being researched and transistors having a width of about 65 nm are contemplated.

The following are examples of transistors with different dimensions. A transistor having a width of about 0.13 µm has a gate width of about 70 µm on a 200 mm diameter wafer. A transistor having a width of about 90 nm may have a gate width of about 50 nm on a 300 mm diameter wafer. A transistor having a width of about 65 nm may have a gate width of about 35 nm on a 300 mm diameter wafer.

There are some advantages of a process for manufacturing a semiconductor having a transistor with a width of about 90 nm over the process for manufacturing a semiconductor having a transistor with a width of about 0.13 µm. High speed and low electric power consumption transistors may be produced, based on fabrication techniques of a gate oxide layer having a thickness of about 1.2 nm, a gate having a width of about 50 nm, and utilization of strained silicon. Manufacturing costs of semiconductor devices may be reduced by using wafers having diameters of about 300 mm.

Despite the rapid progress of semiconductor technology, a typical transistor in a chip remains a Metal Oxide Silicon Field Effect Transistor (MOSFET). The fundamental principle of semiconductor transistor operation (which is characterized by an equation of motion of drift diffusion of an electron as a particle) continues to govern design, despite the transistor being downsized by more than a factor of 50. In other words, the MOSFET fabrication technique is still considered when downsizing techniques are developed.

Some complications exist in fabrication techniques of MOSFETs having a width less than about 0.1 µm. For example, when a width of a transistor is about 10 nm, in view of physics, a quantum mechanical movement of electrons may dominate and the transistor may not operate. This complication may arise due to an electron in a small-scale transistor acting as an individual charge. One proposed solution to this complication is to modify the presently used MOSFET fabrication technique to reduce a short channel effect or side effects due to a quantum effect. Another proposed solution to this complication is to develop a nano-scale device involving a quantum mechanical operation theory which emerges from the classical MOSFET operation theory.

There are some obstacles in manufacturing techniques of CMOS transistors, having widths less than about 0.1 µm. These obstacles may be due to limited space charge layers, tunneling effects, and/or non-uniform doping. These obstacles may arise during lithography, forming gate oxide layers, forming shallow source/drain extensions, and/or forming halo pocket/retrograde wells in small-scale parameters. Consequently, a high permittivity gate oxide layer substitute for $SiO_2$, a technique for improving gate delay, a technique for reducing scattering on a surface between a gate oxide layer and a channel (to increase electron mobility and maintain high driving current) have been researched without producing significant results. However, strained silicon may be used in the semiconductor device during manufacturing of a transistor having a width of about 90 nm.

FIG. 1 is an exemplary graph illustrating an increase of electron mobility using strained silicon in a semiconductor device. The graph of FIG. 1 is a result of a strained silicon semiconductor test conducted by Intel Corporation. In FIG. 1, the vertical axis represents an effective mobility and the longitudinal axis represents a vertical effective field. FIG. 1 illustrates the effective mobility of a general silicon semiconductor 10, strained silicon with silicon-germanium having about 15% germanium atom concentration 15, and strained silicon with silicon-germanium having about 20% germanium atom concentration 16.

Generally, a semiconductor device is operated in a range between about 500 and about 600K V/Cm. Silicon semiconductor 10 exhibits about 270 $cm^2/V°s$ of electron mobility. When the silicon is strained with the 15% silicon-germanium 15, the electron mobility is about 450 $cm^2/V°s$. Likewise, when the silicon is strained with the 20% silicon-germanium 16, the electron mobility is about 480 $cm^2/V°s$. As illustrated, when an active silicon layer is strained with a silicon-germanium epitaxial layer having about 17% germanium atom concentration, the electron mobility increases by over 70%. The semiconductor devices exhibited in FIG. 1 are tested in a two-dimensional way. A matching technique of the strained silicon with the transistor in a three-dimensional way has not been developed, prior to the present invention.

A two-dimensional method of improving the transistor speed using strained silicon in a semiconductor device has been known. In order to improve the transistor integrity and speed, it is required to reduce semiconductor device scale or develop a three-dimensional method. Reducing the semiconductor device scale has some limitations since the shape description technique for an integrated circuit has not been secured in a scale less than about 100 nm. Thus, it is preferable to adopt a three-dimensional device. When the channel width is below about 90 nm, however, a short channel effect and a current leakage through the gate oxide layer may occur. The short channel effect indicates a reduction of an effective channel length due to a diffusion of n-type or p-type impurity atoms in the channel by a heat treatment at a high temperature. When the effective channel length is reduced, a short circuit occurs between the source and the drain in the device having the gate with a minute length.

Poly gates are formed on three faces of the channel transistor in the CMOS structure. The transistor having this structure is called as a Tri-Gate device. The Tri-Gate device may decrease the short channel effect that frequently occurs in a single gate. As is described above, the Tri-Gate device using the strained silicon is very powerful for embodying the transistor having the width less than about 90 nm. However, prior to the present invention, Tri-Gate devices have not been utilized in conjunction with strained silicon.

SUMMARY OF THE INVENTION

Embodiments of the present invention relate to an apparatus including a transistor channel. The channel includes an inner portion and an outer portion. The outer portion surrounds the inner portion and includes strained silicon. Because the outer portion has a relatively large surface area and improved electron mobility due to the strained silicon, a transistor can operate more effectively and efficiently. Accordingly, the transistor can make a computer operate faster while consuming less power.

Embodiments of the present invention provide a semiconductor device and a method of manufacturing the semiconductor device capable of increasing a contact surface between a gate and a channel to reduce current loss. The lattice property of a semiconductor layer in the channel are changed to improve electron mobility. Accordingly, a semiconductor device and a method of manufacturing the semiconductor device are capable of increasing a surface contacting a gate, improving a lattice property of a semiconductor layer, improving current flow through a channel, and reducing electric power consumption of the semiconductor device.

In embodiments, a first semiconductor layer and a second semiconductor layer are sequentially formed on a semiconductor substrate. The second semiconductor layer may have a lattice property different from the first semiconductor layer. The first and second semiconductor layers are then etched to form a first semiconductor structure. A third semiconductor layer, having a lattice property substantially identical to the lattice property of the first semiconductor layer, is formed on the first semiconductor structure. The third semiconductor layer is then etched to form a second semiconductor structure covering the first semiconductor structure. The first and third semiconductor layers may include silicon. The second semiconductor layer may include silicon-germanium. The second semiconductor layer may be formed by an epitaxial growth process. The second semiconductor structure is formed on a top surface and sidewalls of the first semiconductor structure.

As an example of the invention, a semiconductor device includes a first structure formed on a semiconductor substrate and a second structure formed penetrating the first structure. The first structure includes a first semiconductor pattern. The second structure has a lattice property different from the first semiconductor pattern. One portion of the first structure makes contact with a source region formed on one portion of the semiconductor substrate, while another portion of the first structure makes contact with a drain region formed on another portion of the semiconductor substrate. A lower portion of the second structure makes contact with the semiconductor substrate. The second structure additionally includes a third semiconductor pattern. The third semiconductor pattern is formed between the second semiconductor pattern and the semiconductor substrate. The third semiconductor pattern has a lattice property substantially identical to that of the first semiconductor pattern.

According to embodiments of the invention, the contact surface between the channel and the gate may be increased so as to reduce current loss. Further, the lattice property of the semiconductor layer in the channel is changed to improve electron mobility in the channel.

DESCRIPTION OF THE PREFERRED EMBODIMENTS

The invention now will be described more fully hereinafter with reference to the accompanying drawings, in which exemplary embodiments of the invention are described. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. The relative thickness of layers in the illustrations may be exaggerated for purposes of describing the invention.

Figure 1:
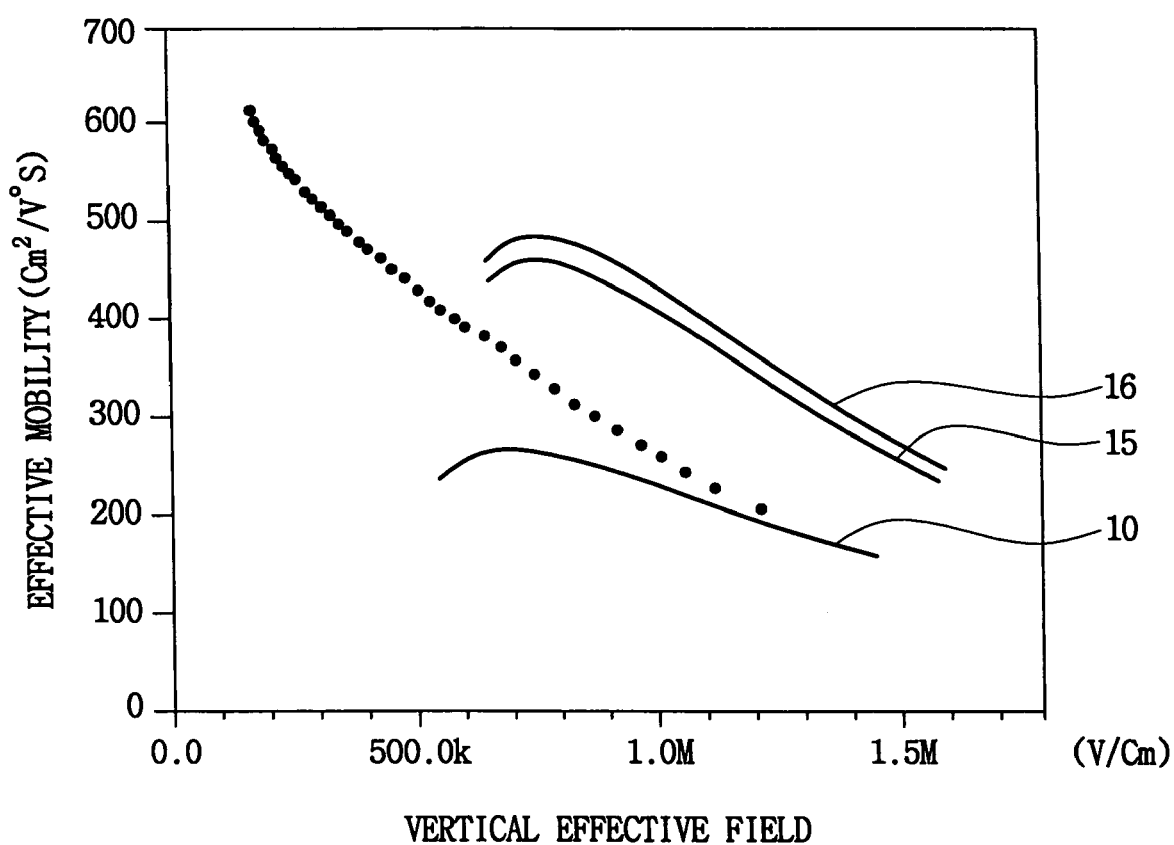
FIG. 1 is an exemplary graph illustrating an increase of electron mobility using strained silicon in a semiconductor device.
Figure 2:
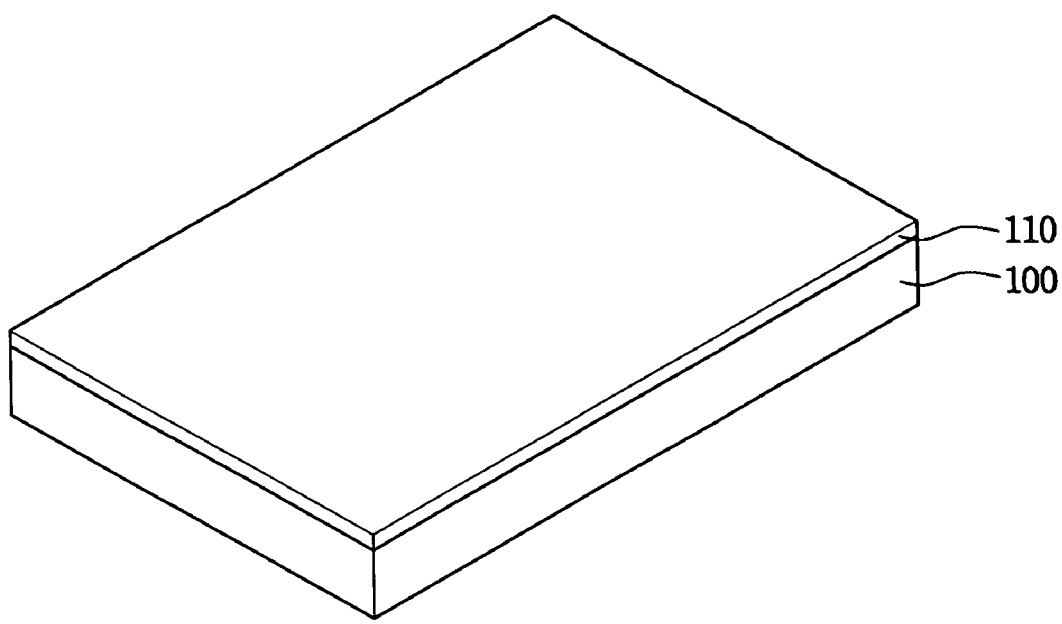
FIGS. 2 to 7 are exemplary views illustrating a method of manufacturing a semiconductor device.
Figure 3:
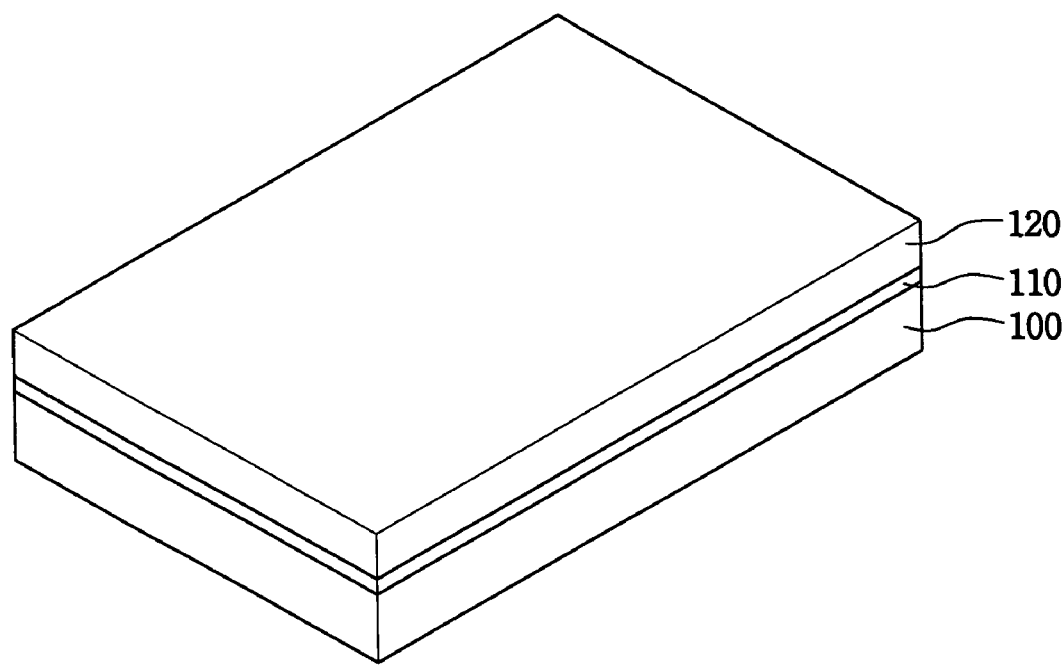
Figure 4:
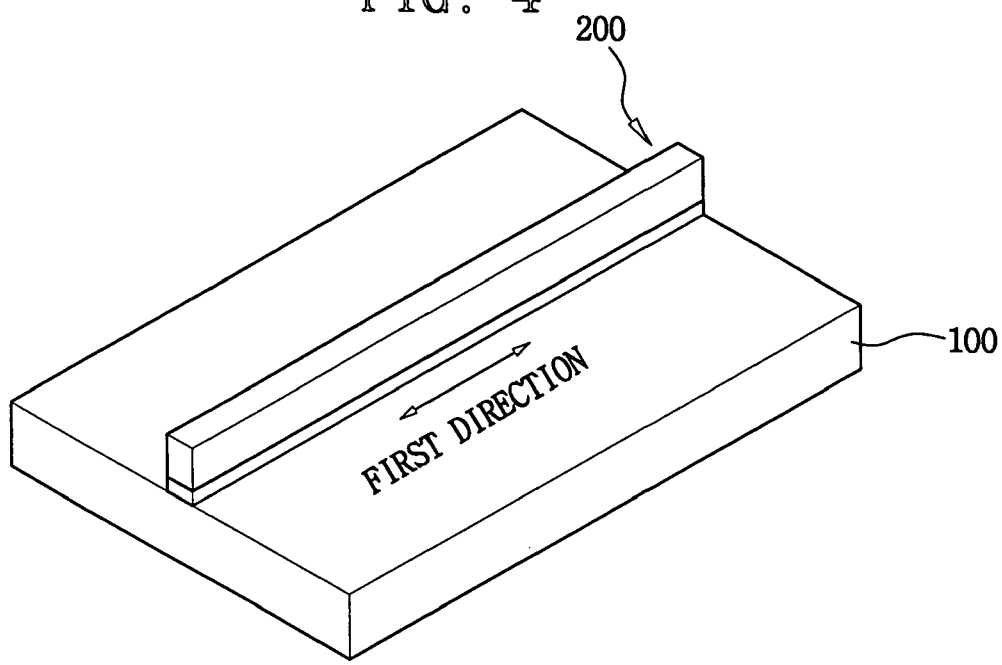

FIGS. 2 to 7 are exemplary views illustrating a method of manufacturing a semiconductor device according to embodiments of the invention. In FIG. 2, the first semiconductor layer 110 is formed on the semiconductor substrate 100. In FIG. 3, the second semiconductor layer 120 is formed on first semiconductor layer 110. The second semiconductor layer 120 has different lattice properties from the first semiconductor layer 110. In FIG. 4, the first semiconductor layer 110 and the second semiconductor layer 120 are etched to form the first semiconductor pattern 200 on the semiconductor substrate 100. The first semiconductor pattern 200 includes a portion of the first semiconductor layer 110 and the second semiconductor layer 120.

Figure 5:
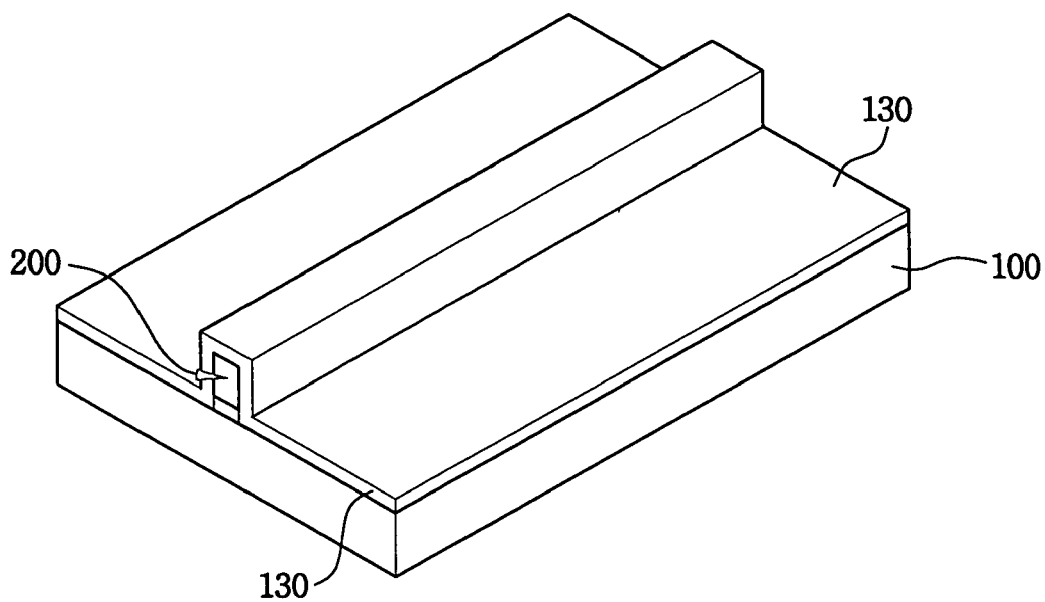
Figure 6:
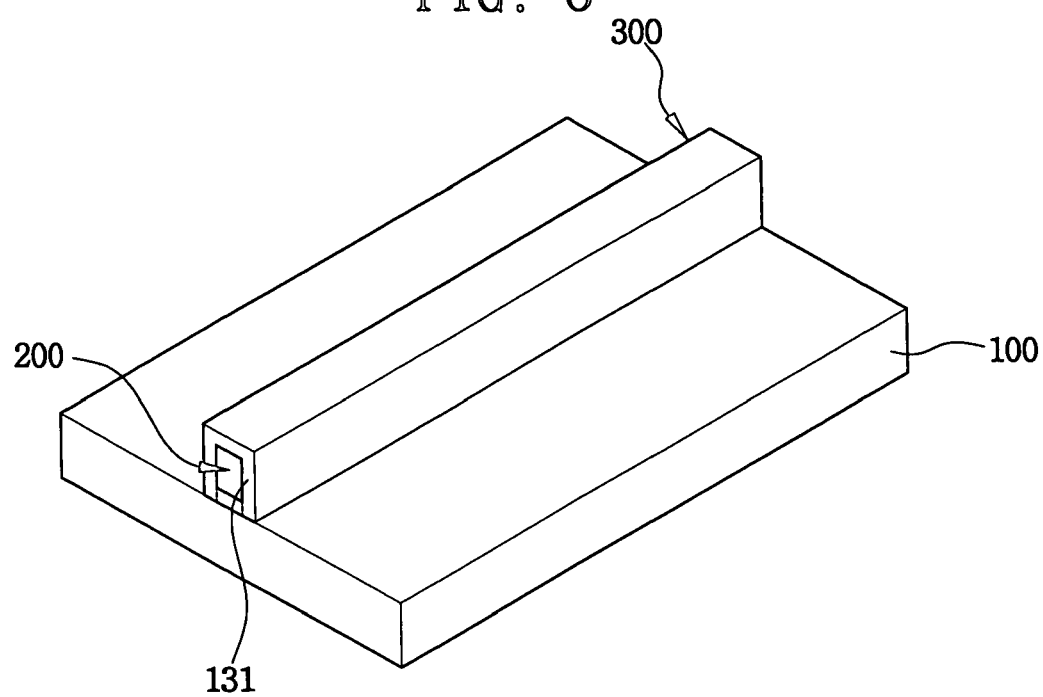
Figure 7:
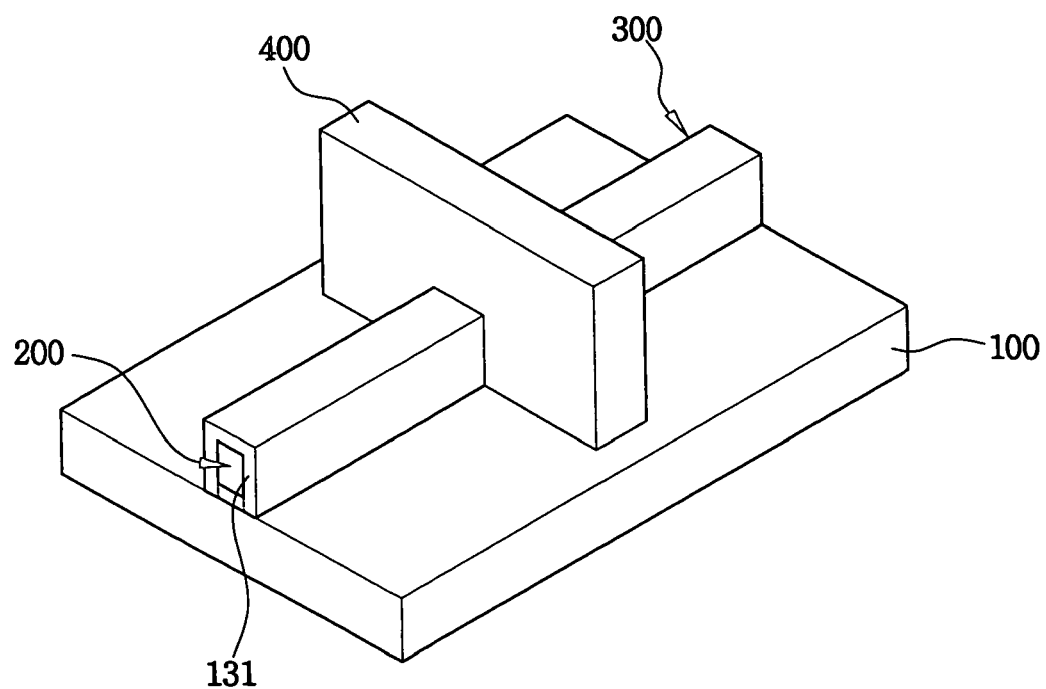

In FIG. 5, the third semiconductor layer 130 is formed over semiconductor pattern 200. The third semiconductor layer 130 is formed over the semiconductor substrate 100. The third semiconductor layer 130 has substantially the same lattice properties as the first semiconductor layer 110. In FIG. 6, the third semiconductor layer 130 is etched to form the second semiconductor pattern 300. The second semiconductor pattern 130 covers the top surface and sidewalls of the first semiconductor pattern 200. In FIG. 7, a gate layer (not shown) is formed over the semiconductor substrate 100 and the second semiconductor pattern 300. This gate layer is etched to form the gate 400, as illustrated in FIG. 7. The gate 400 is substantially perpendicular to the second semiconductor pattern 300.

In embodiments, the semiconductor substrate 100 is an insulation substrate and may include an oxide layer. The first semiconductor layer 110 may include silicon. The first semiconductor layer 110 has an exemplary thickness of approximately 10 to 30 nm. The second semiconductor layer 120 induces crystal structure changes in the first semiconductor layer 110. For example, the second semiconductor layer 120 has lattice properties different from that of the first semiconductor layer 110. This difference in lattice properties will induce a crystal structure change in the first semiconductor layer 110. This change in crystal structure may be attributed to the first semiconductor layer 110 and the second semiconductor layer 120 including different materials that have different crystal structures. These different crystal structures may be directly related to the different lattice properties of the first semiconductor layer 110 and the second semiconductor layer 120.

When the second semiconductor layer 120 is formed on the first semiconductor layer 110, the crystal structure of the first semiconductor layer 110 may be influenced by the crystal structure of the second semiconductor layer 120. This influence may make the first semiconductor layer 110 become strained silicon. In embodiments, the first semiconductor layer 110 includes silicon. In other embodiments, the second semiconductor layer 120 includes silicon germanium and/or silicon carbide. Materials included in the second semiconductor layer 120 can be carefully chosen to modify the crystal structure of the first semiconductor layer 110 to produce strained silicon. In other words, silicon germanium and/or silicon carbide in the second semiconductor layer 120 applies a tensile force to the first semiconductor layer 110.

The first semiconductor layer 110 (including silicon) and the second semiconductor layer 120 (including silicon germanium) are formed. The second semiconductor layer 120 is a strain inducing layer and the first semiconductor layer 110 is a strained layer. The first semiconductor layer 110 may be referred to as a strained silicon layer.

The second semiconductor layer 120 may be formed on the first semiconductor layer 110 in alternative ways in different embodiments. For instance, the second semiconductor layer 120 can be formed either by a deposition process or by an epitaxial growth process. The second semiconductor layer 120 is formed on the first semiconductor layer 110 by the epitaxial growth process at a thickness of approximately 10 to 90 nm.

The first semiconductor layer 110 and the second semiconductor layer 120 are etched using a photolithography process to form the first semiconductor pattern 200. The first semiconductor pattern 200 are formed on the semiconductor substrate 100 in a first direction that is longitudinal to the semiconductor substrate 100. The third semiconductor layer 130 is then formed on the first semiconductor pattern 200. The third semiconductor layer 130 is etched using a photolithography process to form the third semiconductor layer pattern 131. The third semiconductor layer pattern 131 is formed over the top surface and sidewalls of the first semiconductor pattern 200 to complete the second semiconductor pattern 300. The third semiconductor layer 130 has lattice properties substantially the same as the first semiconductor layer 110.

For example, if the first semiconductor layer 110 includes silicon, the third semiconductor layer 130 includes silicon that has substantially the same lattice properties as the first semiconductor layer 110. In other words, the third semiconductor layer 130 may include a material having a crystal structure substantially identical to the material of the first semiconductor layer 110. However, the material of the third semiconductor layer 130 does not necessarily need to be the same as the material of the first semiconductor layer 110. The method of forming the second semiconductor pattern 300 varies depending on the method used for forming the third semiconductor layer 130. When the third semiconductor layer 130 is deposited on the first semiconductor pattern 200, the second semiconductor pattern 300 may be formed using a photolithography process.

The third semiconductor layer 130 is formed over the first semiconductor pattern 200 using an epitaxial growth process. A pre-baking or pre-cleaning process may be performed before this epitaxial growth process. The pre-baking or pre-cleaning process is performed to prevent growth of a natural oxide layer when silicon is exposed. In this pre-baking or pre-cleaning process, the semiconductor substrate 100 may be heated for about 1 minute at a temperature of about 900° C. After the pre-baking or pre-cleaning process, an epitaxial growth process may be performed. In an epitaxial growth process, the semiconductor substrate 100 may be heated for less than approximately two minutes at a temperature of about 900° C. The third semiconductor layer 130 may have a thickness of about 10 to 100 nm. In embodiments, an epitaxial growth process is more advantageous than a photolithography process. For example, when the first semiconductor pattern 200 is grown epitaxially, silicon family material grows on an outer face (e.g. sidewalls) of the first semiconductor pattern 200. Silicon family material formed on the first semiconductor pattern 200 has lattice properties substantially the same as silicon.

The exemplary semiconductor substrate 100 is an insulation substrate. Semiconductor substrate 100 includes an oxide layer. The first semiconductor layer 110 is a silicon layer. The second semiconductor layer 120 is a silicon-germanium layer grown from the first semiconductor layer 110. The third semiconductor layer 130 is a silicon layer epitaxially grown from the first semiconductor pattern 200. The second semiconductor layer 120 is vertically grown from the surface of the first semiconductor layer 110. A germanium concentration in silicon germanium may gradually increase from the first semiconductor layer 110.

A gate oxide layer may be formed over the second semiconductor pattern 300. Gate material is then sequentially formed over the gate oxide layer. The gate material is planarized and etched through a wet etching or dry etching process to form the gate 400. The second semiconductor pattern 300 serves as a channel that contacts the gate 400. A layer forming a spacer is deposited on the gate 400 and subsequently etched to form a spacer. A metal layer may be deposited on the gate 400. A heat treatment can be carried out to form a metal silicide layer on the gate 400. Examples of the metal deposited on the gate 400 include cobalt (Co), nickel (Ni), and lead (Pb). As a design rule of semiconductor devices, it may be necessary to form metal silicide layers on semiconductor devices.

One end of the second semiconductor pattern 300 makes contact with a source region of the semiconductor substrate 100. Likewise, the other end of the second semiconductor pattern 300 may make contact with a drain region of the semiconductor substrate 100. The second semiconductor pattern 300 serves as a channel between a source (i.e. a cathode) and a drain (i.e. an anode). A channel, including electrically conductive silicon, is formed as a current path. A gate oxide layer is formed on a contact surface between the gate 400 and the outer face of the second semiconductor pattern 300 to connect the gate 400 with the channel.

Three-dimensional semiconductor devices and/or reducing the scale of semiconductor devices may be advantageous in increasing transistor integrity and speed. In three-dimensional semiconductor devices, when a channel width is less than about 90 nm, current leakage can occur through a gate oxide layer. The second semiconductor pattern 300 (i.e. the channel) may have a three-dimensional structure. The gate 400 covers the second semiconductor pattern 300, which increases the contact surface between the channel and the gate 400. In other words, a tri-gate structure can be formed along three sides of the channel. Accordingly, problems of a single gate structure related to silicon thickness and current leakage may be alleviated by a tri-gate structure. In embodiments, the second semiconductor pattern 300, a gate oxide layer, the gate 400, a spacer, a source region, a drain region, and a metal silicide layer are structures included in a Metal Oxide Silicon Field Effect Transistor (MOSFET).

In a MOSFET, a gate is formed on a surface of p-type silicon substrate. A source and a drain are formed near the surface of the substrate. A channel, which serves as a current path between the source and the drain is also formed. When a negative voltage is applied to the gate, holes in the substrate are attracted in one direction to gather in the channel to increase the current between the source and the drain. On the other hand, when a positive voltage is applied to the gate, holes are repulsed from the gate to decrease the current between the source and the drain. When more positive voltages are applied to the gate, however, electrons in the semiconductor gather in the channel to increase the current between the source and the drain. The MOSFET amplifies the current flowing through the channel depending on the gate voltage condition.

The depth of a source and a drain are reduced as the semiconductor becomes minute or scaled down. Accordingly, resistance in a source region and a drain region increase in a minute semiconductor device to impair the MOSFET device. On the other hand, a semiconductor device according to embodiments of the present invention may include the second semiconductor pattern 300 and/or a channel vertically formed in a three-dimensional structure to connect a source region and a drain region. Thus, impairment of a MOSFET due to the increased resistance is prevented. In embodiments, a method of manufacturing the semiconductor device includes an ion-injection process injecting impurities in each semiconductor layer in order to improve electrical characteristics of the semiconductor device.

Figure 8:
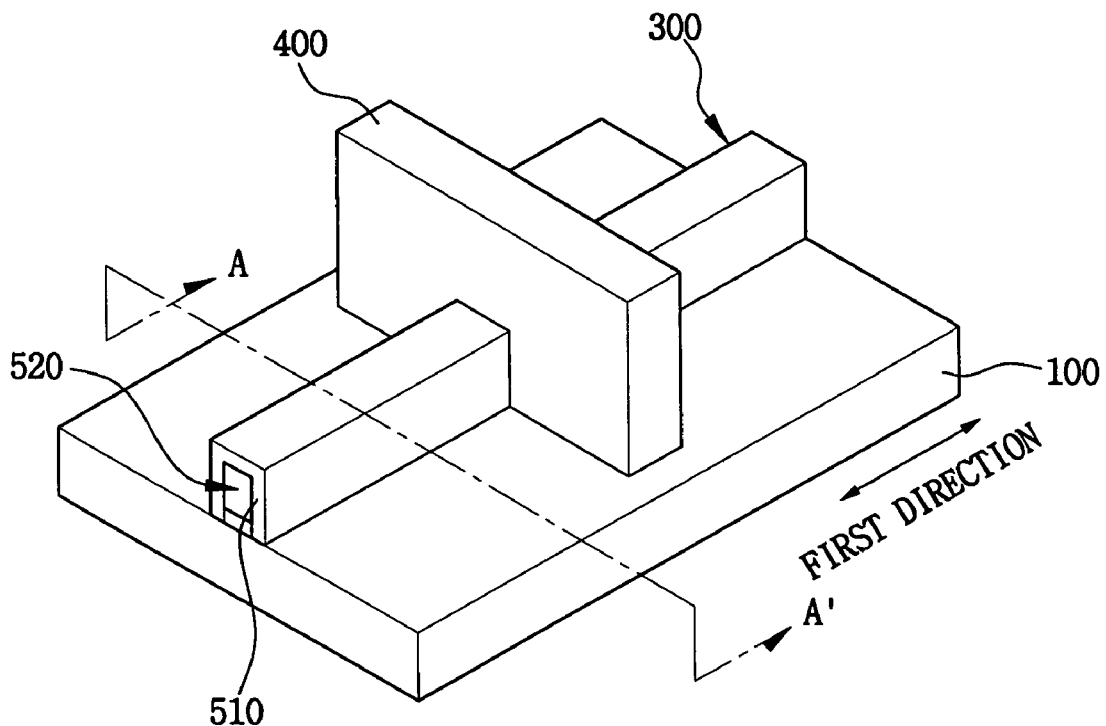
FIG. 8 is an exemplary perspective view illustrating a semiconductor device.
Figure 9:
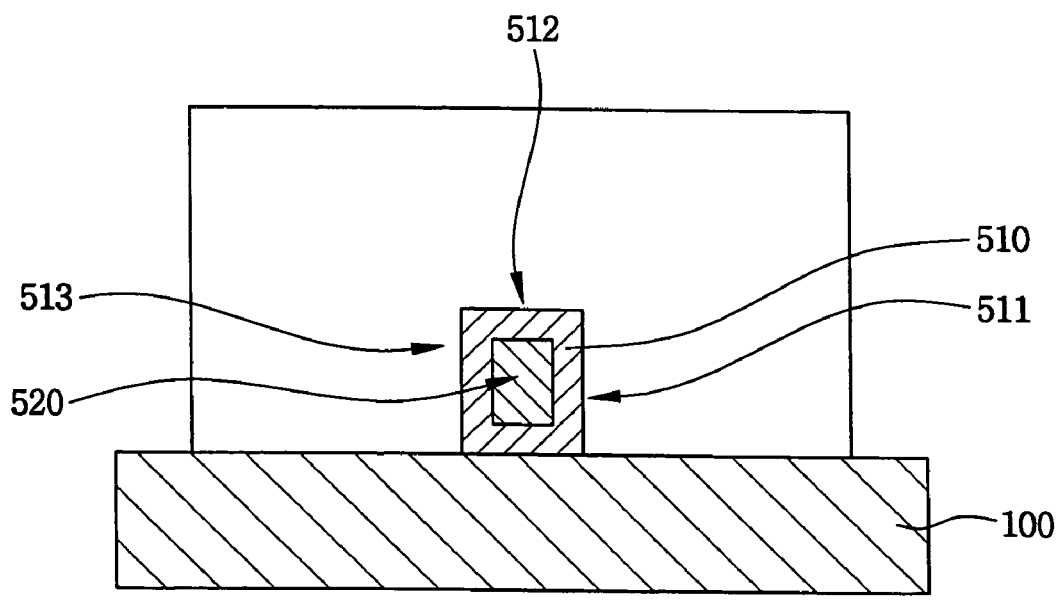
FIG. 9 is an exemplary cross-sectional view illustrating a contact surface between the channel and the gate shown in FIG. 8.
Figure 10:
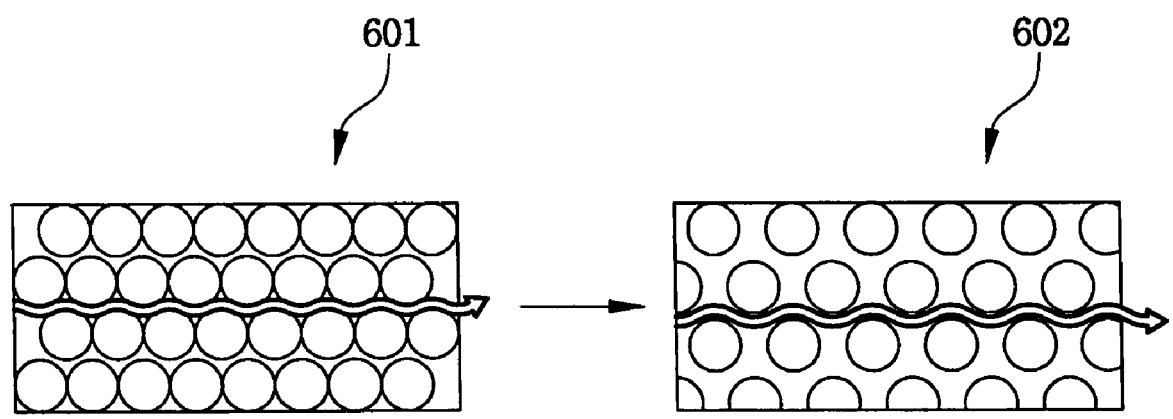
FIG. 10 is an exemplary schematic cross-sectional view illustrating a current flow through the channel shown in FIG. 8.
Figure 11:
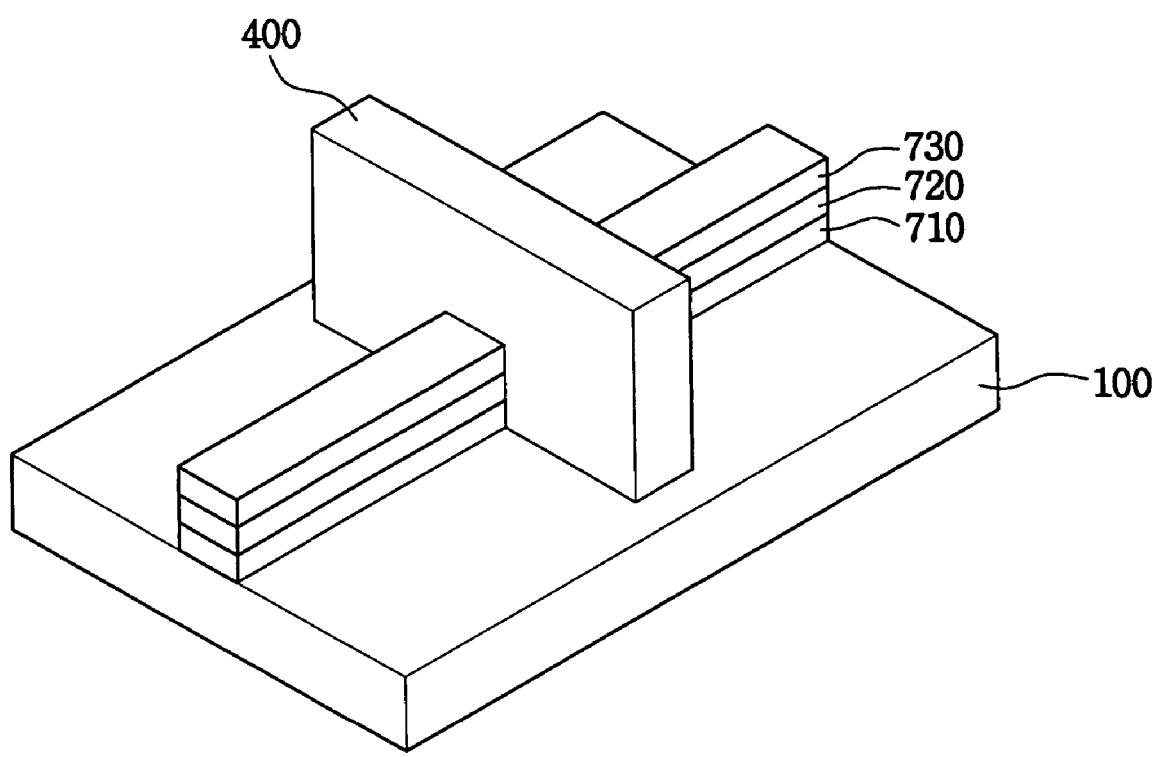
FIG. 11 is an exemplary schematic perspective view illustrating a three-dimensional channel emerged from a two-dimensional channel using strained silicon.

FIG. 8 is an exemplary perspective view illustrating a semiconductor device. FIG. 9 is an exemplary cross-sectional view illustrating a contact surface between the channel and the gate of FIG. 8. FIG. 10 is an exemplary schematic cross-sectional view illustrating a current flow through the channel of FIG. 8. FIG. 11 is an exemplary schematic perspective view illustrating a three-dimensional channel emerged from a two-dimensional channel using strained silicon.

In FIG. 8, the first structure 510 and the second structure 520 are formed on the semiconductor substrate 100. The first structure 510 includes a first semiconductor pattern. The second structure 520 includes a second semiconductor pattern. The second structure 520 has a lattice property different from that of the first semiconductor structure 510. The second semiconductor structure 520 is positioned penetrating the center of the first structure 510.

A gate oxide layer is formed on an outer face of the first structure 510. The gate 400 is formed over the first structure 510. The gate 400 is substantially perpendicular to the first structure 510. A spacer (not shown) is formed on the sidewalls of the gate 400. A metal suicide layer may be formed over a surface of the first structure 510 and/or over the gate 400. Examples of the metal deposited on the structure 510 and the gate 400 include cobalt, nickel, and lead. As a design rule, it may be necessary to form a metal silicide layer in a semiconductor device.

One portion of the first structure 510 may make contact with a source region formed on one portion of the semiconductor substrate 100. Likewise, another portion of the first structure 510 makes contact with a drain region formed on another region of the semiconductor substrate 100. The semiconductor substrate 100 is an insulation substrate including an oxide layer. The first structure 510 includes silicon. A lower portion of the first structure 510 has an exemplary thickness of about 10 nm to 30 nm from the surface of the semiconductor substrate 100. The remaining portions of the first structure 510 have an exemplary thickness of about 10 nm to 100 nm.

The second structure 520 includes a second semiconductor pattern, which induces crystal structure changes in the first structure 510. Accordingly, the second structure 520 has a lattice property different from the first structure 510. The second structure 520 includes either silicon-germanium and/or silicon carbide to modify the crystal structure of silicon. As an example, when the first structure 510 includes silicon, the second structure 520 includes silicon-germanium. The second structure 520 is illustrated longitudinal to the semiconductor substrate 100 and penetrating the center of the first structure 510. In other words, the second structure 520 is formed in the center of the first structure 510 in a longitudinal direction of the semiconductor substrate 100. The second structure 520 is formed from the first structure 510 through an epitaxial growth process. The second structure 520 has an exemplary thickness of about 10 to 90 nm.

The gate 400 is formed on the first structure 510, substantially perpendicular to the first structure 510. The gate oxide layer is formed between the first structure 510 and the gate 400. The first structure 510 serves as a channel in contact with the gate 400. The first structure 510, which is the channel, serves as a current path. The first structure 510 is connected to the gate 400 through a gate oxide layer. The first structure 510, the second structure 520, a gate oxide layer, the gate 400, a spacer, a source region, a drain region, and a metal silicide layer are structures of a MOSFET. A MOSFET amplifies current flowing through a channel according to a gate voltage condition.

When a negative voltages is applied to the gate 400, holes in the semiconductor substrate 100 are attracted in one direction to gather in the channel and increase the current between a source and a drain. When a positive voltage is applied to the gate 400, holes may be repulsed from the gate 400 and decrease the current between a source and a drain. However, when a relatively high positive voltage is applied to the gate 400, electrons in a semiconductor may gather in the channel and increase current between a source and a drain.

The first structure 510 has a three-dimensional structure and the gate 400 has three contact surfaces 511, 512 and 513. The depth of a source and/or a drain can be reduced as the semiconductor becomes minute. Accordingly, resistance in a source region and a drain region increases in a minute semiconductor device to impair a MOSFET device. A semiconductor device according to embodiments of the present invention may increase gate contact surfaces 511, 512 and 513. Gate contact surfaces 511, 512 and 513 contact the gate and the channel and may increase transistor integrity and speed. Increase contact surfaces may also reduce current leakage through a gate oxide layer.

The second structure 520 modifies the crystal structure of the first structure 510. Silicon-germanium (included in the second structure 520) induces tensile force to the silicon included in the first structure 510. This can be attributed to the lattice constants of silicon-germanium and silicon being different. Silicon having modified crystal structure is often referred to as strained silicon. When the crystal structure of the first structure 510 is modified, resistance to the current passing through the first structure 510 is reduced. As illustrated in FIG. 10, electron mobility or hole mobility is improved in the strained silicon lattice 602 over the general silicon lattice 601. This improvement is attributed to the crystal structure of silicon being modified to reduce resistance in electrons.

A three-dimensional channel may be used to improve the transistor integrity and speed. As channel width decreases, a short channel effect or current leakage through a gate oxide layer may occur. Accordingly, it may be desirable to reduce the amount of a gate oxide layer to increase current flow. For this reason, a three-dimensional channel using the strained silicon may be desirable.

A semiconductor channel may be a two-dimensional channel having silicon-germanium, which induces silicon strain, between two silicon layers. When the two-dimensional channel using silicon-germanium is expanded to be a three-dimensional channel, the silicon-germanium pattern 720 is exposed as depicted in FIG. 11. The first silicon pattern 710 and the second silicon pattern 730 are spaced apart and electrically disconnected. A gate oxide layer may be formed on the outer face of the channel and makes contact with the gate. A gate oxide layer is deposited on the silicon. When the silicon-germanium pattern 720 is exposed, an abnormal channel having the gate oxide layer partially formed on the outer surface of the channel is formed. The strain of the first silicon pattern 710 and the second silicon pattern 730 by the silicon-germanium pattern 720 may not be uniform. The Silicon-germanium pattern 720 induces strain of the first silicon pattern 710 and the second silicon pattern 730 only on the regions where the silicon-germanium pattern 720 makes contact with the first silicon pattern 710 or the second silicon pattern 730. Strains in the first silicon pattern 710 and the second silicon pattern 730 may therefore not be uniform.

A channel according to embodiments of the present invention have a three-dimensional silicon channel to suppress the short channel effect and improve the current loss through a gate oxide layer. A silicon-germanium pattern may be formed penetrating a pattern in a silicon channel in a longitudinal direction of a semiconductor substrate to improve electron mobility and reduce electric power consumption. A structure having lattice properties different from that of silicon may be formed penetrating a silicon structure. Accordingly, the contact surface between a channel and a gate may be increased, short channel effect suppressed, and current leakage reduced. Additionally, a semiconductor device having silicon-germanium may be applied to a channel to reduce electron mobility and current loss in the channel.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device comprising a transistor channel, wherein:
   the channel comprises an inner portion and an outer portion;
   the outer portion surrounds the inner portion;
   the inner portion and the outer portion have different lattice properties; and
   a gate formed over the channel, wherein the gate surrounds at least a section of the channel on at least three sides.

2. The apparatus of claim 1, wherein the inner portion comprises silicon-germanium and the outer portion comprises silicon.

3. The apparatus of claim 1, wherein the outer portion surrounds the inner portion on at least three sides.

4. The apparatus of claim 1, wherein the gate is substantially perpendicular to the channel.

5. The apparatus of claim 1, wherein a gate oxide is formed between the channel and the gate.

6. The apparatus of claim 1, wherein a metal suicide layer is formed on a top surface of the gate.

7. The apparatus of claim 1, wherein the thickness of the inner portion is between 10 nm and 90 nm.

8. The apparatus of claim 1, wherein the thickness of the outer portion is between 10 nm and 100 nm.

9. The apparatus of claim 1, wherein the outer portion includes a layer formed between the inner portion and the semiconductor substrate.

10. The apparatus of claim 9, wherein the layer comprises silicon.

11. The apparatus of claim 10, wherein the layer is strained silicon.

12. The apparatus of claim 9, wherein the layer comprises approximately the same lattice property as the outer portion.

13. The apparatus of claim 9, wherein the thickness of the layer is between 10 nm and 30 nm.

14. The apparatus of claim 9, wherein:
   the semiconductor substrate comprises a source region and a drain region; and the channel is coupled to the source region and the drain region.

15. A semiconductor device, comprising:
a substrate;
a channel having an inner portion and an outer portion formed on the substrate, wherein the inner portion and the outer portion have different lattice properties; and
a gate formed over the channel, and wherein the gate surrounds at least a section of the channel on at least three sides.

16. The apparatus of claim 15, wherein a gate oxide is formed between the channel and the gate.

17. The apparatus of claim 15, wherein the gate is substantially perpendicular to the channel.

18. A semiconductor device, comprising:
a substrate;
a channel having an inner portion and an outer portion formed on the substrate, wherein the inner portion and the outer portion have different lattice properties;
a gate formed over the channel, and wherein the gate surrounds at least a section of the channel on at least three sides; and
a source region and a drain region coupled to the channel.

19. The apparatus of claim 18, wherein the gate is substantially perpendicular to the channel.

20. The apparatus of claim 18, wherein a gate oxide is formed between the channel and the gate.

* * * * *